United States Patent [19]
Hayden et al.

[11] Patent Number: 5,122,347
[45] Date of Patent: Jun. 16, 1992

[54] VERTICAL ULTRAVIOLET EXPOSURE UNIT

[75] Inventors: Gary E. Hayden, Lombard; Thomas G. Wojciechowski, Oak Lawn; Jeffrey F. Kotz, Schaumburg; Juzer Mohammed, Naperville, all of Ill.

[73] Assignee: AG Communication Systems Corporation, Phoenix, Ariz.

[21] Appl. No.: 636,340

[22] Filed: Dec. 31, 1990

[51] Int. Cl.$^5$ .............................................. B01J 19/08
[52] U.S. Cl. .............................. 422/186.3; 204/180.6
[58] Field of Search ............... 422/186, 186.3, 186.04, 422/186.05, 186.06; 428/901, 913; 430/311

[56] References Cited

U.S. PATENT DOCUMENTS

| | | | |
|---|---|---|---|
| 3,790,801 | 2/1974 | Coleman | 250/453 |
| 4,410,562 | 10/1983 | Nemoto et al. | 427/54.1 |
| 4,913,930 | 4/1990 | Getson | 427/58 |

FOREIGN PATENT DOCUMENTS 62-6261  1/1987  Japan .................................. 430/311

Primary Examiner—Brooks H. Hunt
Assistant Examiner—Daniel J. Jenkins
Attorney, Agent, or Firm—Robert J. Black; Gregory G. Hendricks

[57] ABSTRACT

An ultraviolet exposure unit for exposing both sides of a printed circuit board to ultraviolet light to cause ultraviolet sensitive materials which have been applied to said printed circuit board to cure. A vertically positioned curing chamber and a printed circuit board carrier system provide vertical orientation and simultaneous application of ultraviolet light to both sides of the printed circuit board when such ultraviolet materials are applied to both sides of the printed circuit board.

10 Claims, 1 Drawing Sheet

VERTICAL ULTRAVIOLET EXPOSURE UNIT

BACKGROUND OF THE INVENTION

1. Field of the Invention

The present invention relates to ultraviolet curable materials and particularly to a unit for curing ultraviolet curable materials on both sides of a printed circuit board.

2. Related Prior Art

An increasing amount of materials are becoming available on the market which use ultraviolet light to achieve a tack-free cure. The advantage of these materials over their air or heat cured predecessors is speed of cure. Cure times of 2-24 hours were previously the norm for curing of coatings. Today, with ultraviolet curable materials, cure times of 2-10 seconds are commonplace.

Ultraviolet units are currently available which will cure a printed circuit board placed horizontally on a conveyor belt. The cure is only affected on the side which is exposed to the curing lamps leaving the other side of the printed circuit board unexposed. This makes it necessary to repeat the exposure cycle with the other side of the printed circuit board exposed to the ultraviolet source. This is acceptable when the material to be cured requires only a final cure to harden the material and is relatively tack-free to begin with (such as a soldermask). It is also acceptable if the material is to be applied one side at a time (as in spray coating). This horizontal conveyor system is, however, unacceptable in the event that a liquid coating, such as an ultraviolet curable conformal coating, is being applied by dip-coating or another coating method which coats both sides of the printed circuit board prior to curing. It is this application which requires an ultraviolet curing system which will simultaneously cure both sides of a printed circuit board without the need to place the printed circuit board on a conveyor belt.

SUMMARY OF THE INVENTION

The vertical ultraviolet exposure unit consists of five primary components:

A curing chamber including a center track, an ultraviolet light containment system and openings for ultraviolet lamps and an air inlet.

A vertical printed circuit board carrier system including a mechanical system and an electrical system including motor controls.

Ultraviolet exposure lamps including an ultraviolet light source, power supplies and cooling fans.

A ventilation and exhaust system including air flow and exhaust fans.

A unit housing.

Each of these components is described below.

The curing chamber is constructed of aluminum and is oriented vertically down the center of the unit. Contained within the chamber is the centering track through which the printed circuit board and printed circuit board carrier pass, the ultraviolet light containment system, and the openings for the exposure lamps and air inlet.

The curing chamber is the main component in the exposure unit design. It is the space in which all exposure to ultraviolet light occurs. It also provides a safe working environment for the operator by containing all ultraviolet light generated during the exposure process.

The vertical printed circuit board carrier system provides for the transport of the printed circuit board through the curing chamber at a controlled rate and can be divided into its two components: a mechanical system consisting of the printed circuit board carrier frame, carrier cable, sheave, and motor; and an electrical system comprised of all motor controls.

The electrical system is used to control both the speed of the motor and its direction. Regulation of the motor speed is possible with the use of a commercial available speed controller. The controller selected allows for the motor output to be adjusted from 20%-100% with no loss of motor torque.

The exposure lamps consist of an ultraviolet light source, power supplies, and cooling fans integral to the light source housing. The lamps are manufactured by American Ultraviolet Co.

The ventilation and exhaust system is designed to provide cooling inside the unit housing by venting any heat generated by the lamps to the outside. It will also exhaust any fumes generated during curing of the material to the outside.

All airflow is directed out through two exhaust fans to an external duct. The external duct is attached to an exhaust drop with a capacity large enough to handle the output of the system.

The unit housing is constructed of galvanized steel and its purpose is to contain all operating systems.

BRIEF DESCRIPTION OF THE DRAWINGS

A better understanding of the present invention may be had from a consideration of the following detailed description taken in conjunction with the accompanying drawings in which.

DESCRIPTION OF THE PREFERRED EMBODIMENT

The vertical ultraviolet exposure unit consists of five primary components. These are:

1) a curing chamber including a centering track, an ultraviolet light containment system and openings for ultraviolet lamps and air inlet;
2) a vertical printed circuit board carrier system including a mechanical system and an electrical system including motor controls;

3) ultraviolet light exposure lamps including an ultraviolet light source, power supplies, and cooling fans;
4) a ventilation and exhaust system including an air flow arrangement and exhaust fans; and
5) a unit housing to enclose all of the above.

Figure 1:
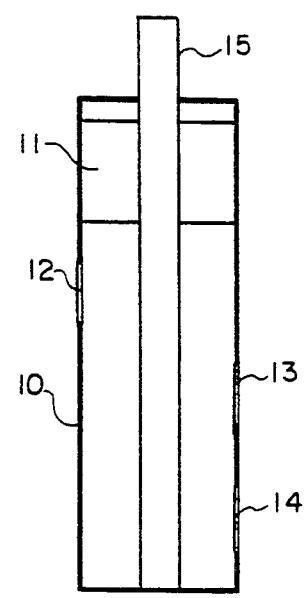
FIG. 1 is a sectional view of the curing chamber for a vertical ultraviolet exposure unit in accordance with the present invention.
Figure 2:
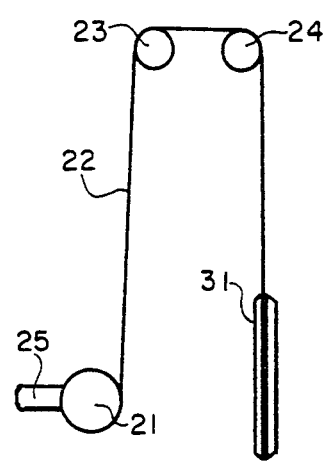
FIG. 2 is a mechanical schematic diagram of the vertical printed circuit board carrier system for use in the vertical ultraviolet exposure unit of the present invention.
Figure 4:
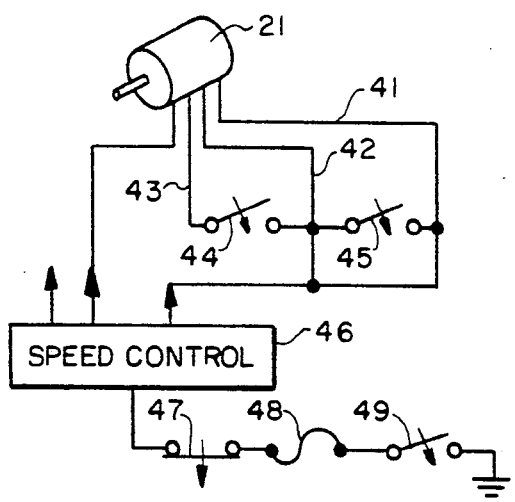
FIG. 4 is a partial schematic diagram of the electrical system and motor controls as used in the vertical ultraviolet exposure unit in accordance with the present invention.

Referring first to FIG. 1, the vertical printed circuit board carrier system provides for the transport of printed circuit boards through a curing chamber at a controlled rate and can be divided into two components—a mechanical system as shown in FIG. 2 consisting of printed circuit board carrier frame 31, carrier cable 22, sheave 21, pulleys 23 and 24, and motor 25. The electrical system as shown in FIG. 4 comprises all the motor controls. The motor is a 6.7 rpm 1/15 horsepower AC/DC right angle gear motor capable of developing 1.162 inch pounds of torque.

The sheave 21 attached to the shaft of the motor 25 is three inches in diameter and is made of steel. The carrier cable 22 attached to the sheaves so that when the printed circuit board carrier is in a fully down position where it is at the bottom of its travel, there is no more cable wrapped around the sheave. The size of the motor and the sheave were selected in order to achieve running speeds consistent with the speed at which full cure could be realized. The carrier cable 22 is uncoated miniature cable constructed of galvanized steel with a breaking strength rated at 110 pounds. Pulleys 23 and 24 are made of zinc plated steel. The carrier, cable, sheave and pulleys are selected so as to be compatible with each other in regards to both wear and fatigue.

The curing chamber 10 shown in FIG. 1 is constructed of black anodized aluminum and is oriented vertically down the center of the centering track 15. Contained within the chamber is a centering track 15 through which the printed circuit board and printed circuit board carrier pass. The light containment system 11 is also included as well as openings 12 and 13 for ultraviolet exposure lamps and an air inlet 14.

The curing chamber 10 is the main component to the exposure unit design. It is a space in which all exposure to ultraviolet light occurs. It also provides a safe working environment by containing all ultraviolet light generated during the exposure process.

The centering tracks 15 are located vertically down the center of the chamber on opposing sides. They are constructed of black anodized aluminum and are the means for keeping the printed circuit board centered between the two ultraviolet exposure units positioned at openings 12 and 13.

The openings 12 and 13 for insertion of the ultraviolet sources are provided on opposing sides of the curing unit 10. They are staggered to avoid having the two sources facing directly at each other. The combined light from the two lamps would overheat the bulbs causing them to degrade quickly. For this reason, a black anodized finish was chosen for use throughout the curing chamber to minimize reflection of light back onto the ultraviolet light sources.

Light containment is achieved through the use of two sets of spring loaded doors 64 and 65 also constructed of black anodized aluminum. Each set of doors having an outer door and an inner door (not shown). The area inside the chamber between the two sets of doors serves as an air lock. During operation, one or both of the sets of doors remain closed at all times ensuring that no ultraviolet light escapes.

The air inlet 14 is connected to a filter duct which vents to outside air. This duct provides the only source of air present in the exposure unit. Air is filtered to keep air-bourne containments inside the chamber to a minimum.

Figure 3A:
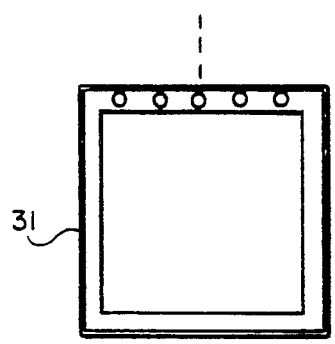
FIG. 3A is a front view of a printed circuit board carrier frame for use in a vertical ultraviolet exposure unit in accordance with the present invention.
Figure 3B:
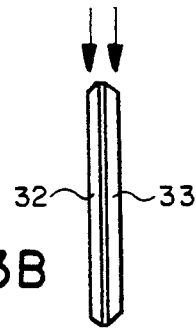
FIG. 3B is a side view of a printed circuit board carrier frame for use in a vertical ultraviolet exposure unit in accordance with the present invention.

The printed circuit board carrier frame, FIG. 3A, is constructed of black anodized aluminum. It is designed to carry printed circuit boards throughout the curing cycle while protecting it from contact with the light containment doors. The carrier frame 31 is rectangular in shape and is large enough to accommodate most printed circuit boards. Across the top of the frame are holes to be used for suspending the carrier frame from the carrier cable and for hanging the printed circuit board to be cured. On either side of the frame running vertically are flanges 32 and 33 as may be seen by reference to FIG. 3B, which extend both to the front and to the rear. The purpose of these flanges is to insure clearance between the inner and outer doors of each set of doors so they do not make contact with the printed circuit board being cured.

The electrical system as shown in FIG. 4 is used to control both the speed of the motor and its direction. Regulation of the motor speed is possible with use of a commercially available speed controller 46. The controller selected allows for the motor output to be adjusted from 20% to 100% with no loss of motor torque. The hesitation switches 43, 44, and 45, and two microswitches not shown serve to stop the carrier at the top of the cycle and to reverse the direction of the motor.

The final component of the electrical system are the emergency cutoff switch 47 and fuse 48 as well as "off-/on" switch 49. The switch is wired into the incoming power and there is a "panic" button in case of emergency. It overrides the on/off toggle switch 49 and shuts off power to the printed circuit board carrier system. Resetting the system involves twisting the emergency cutoff to restore to its normally closed position. This switch 47 along with fuse block which includes fuse 48 to serve as safety protection is for the carrier system.

Figure 5:
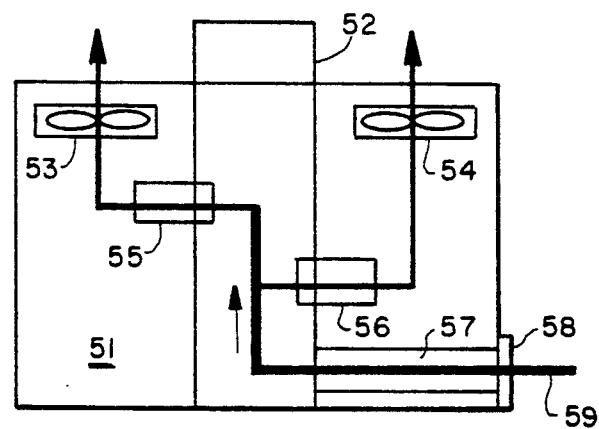
FIG. 5 is an inside view of a vertical ultraviolet exposure unit in accordance with the present invention.

The exposure lamps shown as ultraviolet light sources 55 and 56 in FIG. 5 and power supplies and cooling fans 53 and 54 integral to the ultraviolet light source housing are all manufactured by American Ultraviolet Company.

The ultraviolet lights source 55 or 56 is a five inch medium pressure mercury arc lamp capable of operating at 200 watt inches or 300 watt inches. The higher of these two operating modes is used for curing while the lower is intended as an idle state. Inside the source housings 55 or 56 is a reflector which focuses the ultraviolet on the object to be cured. This reflector creates a 4.5"×6.0" curing area five inches from the lamp.

The power supplies provided with the ultraviolet sources supply the electricity and control. They operate 110 volt AC and 15 amps. Each of the two light sources requires its own individual power supply.

Also running off each power supply are the cooling fans integral to the ultraviolet light source housing. These cooling fans 53 and 54 are designed to provide a flow of air around the lamps which operate temperatures of 600–800 degrees centigrade. An airflow of 300 cubic feet per minute is necessary to keep the light sources cooled per the manufacturer's recommendations.

The ventilation and exhaust system shown in FIG. 5 is designed to provide cooling inside the unit housing by venting any heat generated by the lamps to the outside by way of the paths as shown and also exhaust any fumes generated during curing the material to the outside.

Several components of the ventilation exhaust have already been described. They are the air inlet 59 and filter 58 described in the section on the curing chamber and the cooling fans integral to the ultraviolet light sources described above. These two components along with the two cooling fans 53 and 54 placed in the housing power supplies and an external duct to comprise the ventilation and exhaust system.

The system is designed as a pass-through system where the air enters the system, passes through the various components and exits the system taking with it any fumes the heat generated in the curing process. The two additional exhaust fans placed in the unit housing 53 and 54 operate off a separate power supply at 48 volts each. The fans used are Patriot DC brushless fans. Each is 6.75"×2" deep. These two fans work in parallel to develop 304 cubic feet a minute at a pressure head of 0.19 H2O. These fans are assumed to be 50% efficient under the operating conditions in the unit housing. Temperature rise in the system will be 17.56 degrees centigrade. The ultraviolet source manufacturer allows a 20 degree centigrade rise in an enclosed cabinet. All air flow is directed out through the two exhaust fans 53 and 54 to an external duct not shown. The external duct is attached in exhaust drop of a capacity large enough to handle the 300 cubic feet per minute of the system.

Figure 6:
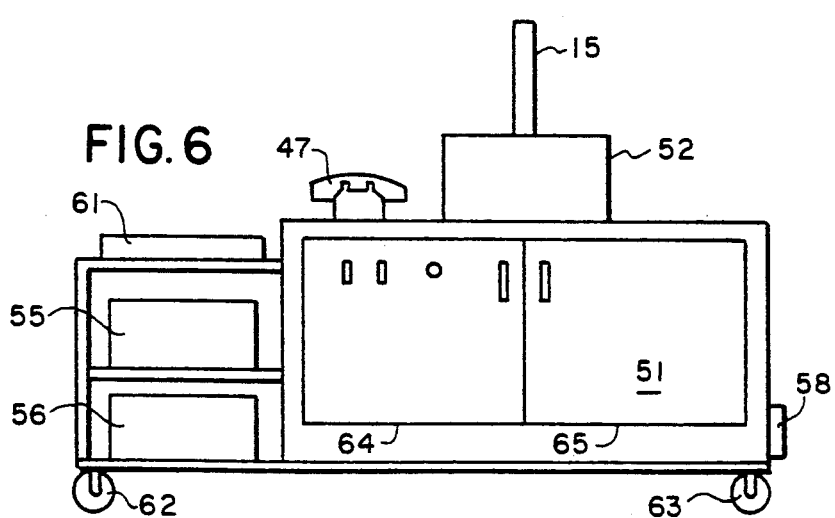
FIG. 6 is an outside side view of a vertical ultraviolet exposure unit in accordance with the present invention.

The unit housing shown in FIG. 6 is constructed of galvanized sheet metal and is painted black inside. Its purpose, of course, is to contain all the operating systems. An internal frame of angle iron serves as the skeleton on which all operating systems are mounted. The front of the housing opens by means of two doors. One door serves as a control panel with the carrier system motor controls mounted through it. The emergency cutoff switch 47 is located on top of the unit housing to the left of curing chamber 52. The unit housing 51 rests on a steel cart equipped with casters 62 and 63 for portable usage. Also mounted on the cart is a shelf unit for supporting the two ultraviolet power supplies 55 and 56 as well as the exhaust fan power supply 61.

Not shown but extending off the back is a duct designed to handle the exhaust from the exhaust fans. It also serves as a connection to the external ventilation system, as required.

Operation of the system in accordance with the present invention is as follows:

The method of operation involves a start up of all systems, processing materials to be cured and shutdown of all systems. The exhaust fan system is first started by turning the fan power supply to the "on" position. Voltage is adjusted to 48 volts DC. The ultraviolet source are the next components to be started. They are started by first setting the lamp intensity switch to the "high" position. The power switch on each individual power supply is then set to the "on" position. At this point, the pilot lamp should be lit and the ultraviolet source cooling fans should go on. The lamp switch on the power supplies is set to the "on" position and the watt meter would indicate that the ultraviolet lamp is on. At least four minutes is required for the ultraviolet lamps to warm up. The watt meter should gradually rise to the 1500 watt mark indicating the lamp is ready. Lamps are now ready for curing at this time. The intensity switch will be used to put the unit in an idle mode. One minute should be allowed for the unit to reach full power once the intensity switch is moved from the "low" to the "high" position.

The printed circuit board carrier system is the last component to be turned on. The "hesitation" switch is moved to the "middle" or "neutral" position, moving the "on/off" toggle switch to the "on" position makes the exposure unit ready to cure printed circuit boards. A printed circuit board is hung from the printed circuit board carrier frame by inserting hooks into the board. These hooks have been inserted in the holes across the top of the carrier frame. The "hesitation" switch is then moved into a position which activates the motion of the carrier frame. The desired direction of the motor rotation depends on the direction which the carrier cable is wound around the sheath. In moving the "hesitation" switch into one of the active positions does not begin the exposure cycle and moving to the other active position will.

After completion of each exposure cycle, the cured printed circuit board is removed from the carrier frame and an uncured printed circuit board is hung in its place. The next exposure cycle is then activated by moving the "hesitation" switch to the other active position. This continues for each printed circuit board being cured. To shut the unit down the printed circuit board carrier system is turned off using the "on/off" toggle switch. The ultraviolet lamps are shut down according to procedures in the instruction manual provided with the lamps and finally the exhaust system is turned off by using the "on/off" toggle switch on the fan power supply.

While but a single embodiment is shown of the present invention, it would be obvious to those skilled in the art that numerous modifications may be made without departing from the spirit of the invention which shall be limited only by the scope of the claims appended hereto.

What is claimed is:

1. A unit for simultaneously exposing both sides of a printed circuit board to ultraviolet light to cure ultraviolet sensitive material applied to said board, said unit comprising:
    a unit housing including;
    a carrier system for moving a printed circuit board within said unit in a vertical position;
    a curing chamber through which said carrier system moves said vertically positioned printed circuit board;
    a plurality of ultraviolet light sources within said curing chamber, operated when said printed circuit board is within said curing chamber whereby said ultraviolet sensitive material applied to said board is simultaneously cured on both sides.

2. An ultraviolet exposure unit as claimed in claim 1 wherein:
    there is further included a ventilation and exhaust system operated to remove heat generated by said light sources from within said unit.

3. An ultraviolet exposure unit as claimed in claim 2 wherein:
    said ventilation and exhaust system includes an air flow path and a plurality of exhaust fans operated to move air through said air flow path to exhaust heat generated by said light sources from within said unit.

4. An ultraviolet exposure unit as claimed in claim 1 wherein:

said carrier system comprises a mechanical system for moving said printed circuit board;

and an electrical system for controlling said mechanical system.

5. An ultraviolet exposure unit as claimed in claim 4 wherein:

said mechanical system includes a cable connectable to a printed circuit board carrier frame;

and a motor and a plurality of pulleys operated to position and move said printed circuit board through said curing chamber.

6. An ultraviolet exposure unit as claimed in claim 4 wherein:

said electrical system comprises a reversible motor and a speed control unit operated to control the speed of operation of said motor.

7. An ultraviolet exposure unit as claimed in claim 6 wherein:

said electrical system further includes a plurality of switches and a fuse.

8. An ultraviolet exposure unit as claimed in claim 1 wherein:

said plurality of ultraviolet light sources each comprise an ultraviolet lamp and an associated power supply.

9. An ultraviolet exposure unit as claimed in claim 8 wherein:

each of said ultraviolet light sources further includes a cooling fan operated to reduce heat generated by said lamp.

10. An ultraviolet exposure unit as claimed in claim 1 wherein:

said unit housing is internally colored black to minimize reflection of light back onto said ultraviolet lamp sources.

* * * * *